US012020876B2

(12) United States Patent
Kasugai et al.

(10) Patent No.: US 12,020,876 B2
(45) Date of Patent: Jun. 25, 2024

(54) SWITCH DEVICE AND SWITCH SYSTEM

(71) Applicant: Panasonic Intellectual Property Management Co., Ltd., Osaka (JP)

(72) Inventors: Hiroyuki Kasugai, Gifu (JP); Keiyu Takewaka, Fukui (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 0 days.

(21) Appl. No.: 17/575,350

(22) Filed: Jan. 13, 2022

(65) Prior Publication Data

US 2022/0230822 A1 Jul. 21, 2022

(30) Foreign Application Priority Data

Jan. 19, 2021 (JP) ................................. 2021-006322

(51) Int. Cl.
| | |
|---|---|
| *H01H 19/14* | (2006.01) |
| *H01H 41/06* | (2006.01) |
| *H03K 3/01* | (2006.01) |
| *H03K 3/037* | (2006.01) |
| *H01H 19/00* | (2006.01) |

(52) U.S. Cl.
CPC ............. *H01H 19/14* (2013.01); *H03K 3/01* (2013.01); *H03K 3/037* (2013.01); *H01H 2019/006* (2013.01); *H01H 41/06* (2013.01)

(58) Field of Classification Search
CPC ........... H01H 19/14; H03K 3/01; H03K 3/037
See application file for complete search history.

(56) References Cited

U.S. PATENT DOCUMENTS

| | | | | |
|---|---|---|---|---|
| 2007/0140454 | A1* | 6/2007 | Ito .................... | B60R 11/0264 379/159 |
| 2012/0112558 | A1* | 5/2012 | Ibe ..................... | H01H 13/70 307/113 |

FOREIGN PATENT DOCUMENTS

| | | | | |
|---|---|---|---|---|
| CN | 102239289 | A * | 11/2011 | ......... A47L 15/0047 |
| CN | 105610216 | A * | 5/2016 | ............ H02J 7/0052 |
| EP | 1484779 | A2 * | 12/2004 | ............. B60K 37/06 |
| JP | 198687360 | U | 6/1986 | |

(Continued)

OTHER PUBLICATIONS

Japanese Notice of Reasons for Refusal dated Apr. 2, 2024, for the corresponding Japanese Patent Application No. 2021-006322, 13 pages. (With English Translation).

*Primary Examiner* — Metasebia T Retebo
*Assistant Examiner* — James G Yeaman
(74) *Attorney, Agent, or Firm* — Seed IP Law Group LLP

(57) ABSTRACT

A switch device includes: a voltage dividing circuit that outputs a voltage dividing value corresponding to a conduction state of each of a first switch and a second switch to an output line; an operation interface including a dial which rotates in accordance with a user operation; a rotation detection circuit that detects (i) rotation of the dial by a predetermined angle and (ii) a rotation direction of the dial, and generates an angle signal which includes a pulse indicating detection of the rotation by the predetermined angle, and a direction signal which indicates whether the rotation direction is a first direction or a second direction; and a selection circuit that selects whether to output the pulse of the angle signal to control the first switch or to output the pulse to control the second switch, according to whether the direction signal indicates the first or the second direction.

8 Claims, 8 Drawing Sheets

(56) References Cited

FOREIGN PATENT DOCUMENTS

| | | | | |
|---|---|---|---|---|
| JP | H11331960 | A | | 11/1999 |
| JP | 2003050114 | A | | 2/2003 |
| JP | 2003063326 | A | | 3/2003 |
| JP | 2006234504 | A | * | 9/2006 |
| JP | 2011-210581 | A | | 10/2011 |
| JP | 2012044351 | A | * | 3/2012 |
| JP | 5870977 | B2 | * | 3/2016 ........... F02D 41/009 |
| JP | 2016116319 | A | * | 6/2016 |
| JP | 6792498 | B2 | * | 11/2020 |
| KR | 200182974 | Y1 | * | 5/2000 |
| KR | 20200130956 | A | * | 11/2020 |
| KR | 20200130956 | A | * | 11/2020 |

\* cited by examiner

SWITCH DEVICE AND SWITCH SYSTEM

CROSS REFERENCE TO RELATED APPLICATION

The present application is based on and claims priority of Japanese Patent Application No. 2021-006322 filed on Jan. 19, 2021.

FIELD

The present disclosure relates to a switch device and a switch system.

BACKGROUND

Patent Literature (PTL) 1 discloses a switch device provided on a steering wheel.

PATENT LITERATURE

PTL 1: Japanese Unexamined Patent Application Publication No. 2011-210581

SUMMARY

However, the switch device according to PTL 1 can be improved upon.

In view of this, the present disclosure provides a switch device capable of improving upon the above related art.

A switch device according to one aspect of the present disclosure is a switch device including: a voltage dividing circuit that includes a plurality of switches including a first switch and a second switch, an output line, and a plurality of resistors connected in series to the output line, and outputs a voltage dividing value corresponding to a conduction state of each of the plurality of switches to the output line; an operation interface that includes a dial which rotates in accordance with a user operation; a rotation detection circuit that detects (i) rotation of the dial by a predetermined angle and (ii) a rotation direction of the dial, and generates an angle signal and a direction signal, the angle signal including a pulse that indicates detection of the rotation by the predetermined angle, the direction signal indicating whether the rotation direction is a first direction or a second direction different from the first direction; and a selection circuit that selects whether to output the pulse of the angle signal to control the first switch or to output the pulse of the angle signal to control the second switch, according to whether the direction signal indicates the first direction or the second direction.

A switch system according to one aspect of the present disclosure is a switch system including: the above-described switch device; and a determination device that determines a switch in a conducting state among the plurality of switches based on the voltage dividing value transmitted from the output line.

Note that this general or specific aspect may be implemented using any combination of, for example, systems, methods, or integrated circuits.

A switch device according to one aspect of the present disclosure is capable of improving upon the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

DESCRIPTION OF EMBODIMENTS

Figure 1:
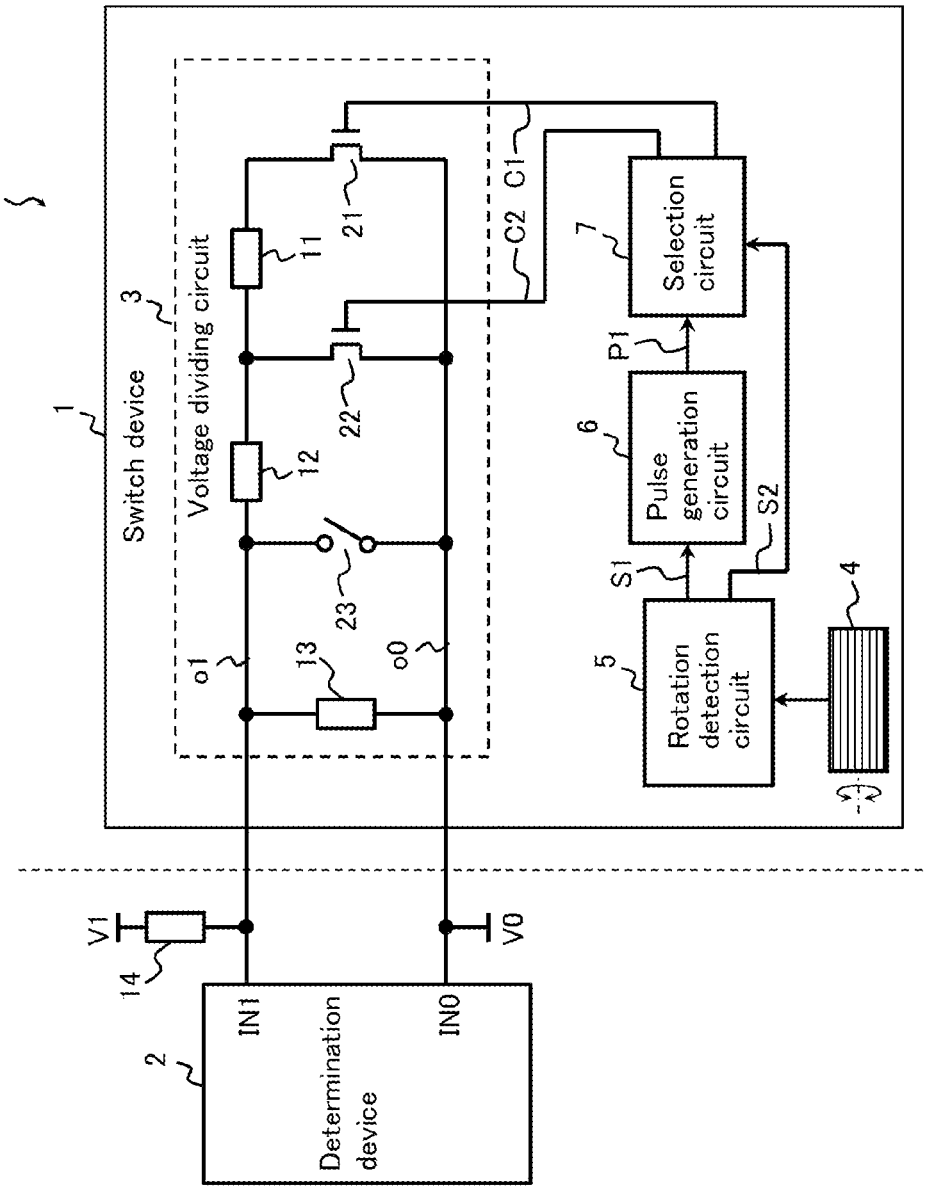
FIG. 1 is a block diagram illustrating a configuration example of a switch system according to Embodiment 1.

The switch device of PTL 1 includes a plurality of resistors connected in series and a voltage dividing circuit having a plurality of switches connected to ends of the resistors. The switch device outputs a voltage dividing value corresponding to a position of a switch pressed by a user to one output line. An ECU (Electronic Control Unit) connected to the switch device detects which switch among the plurality of switches has been pressed, by the voltage dividing value communicated from the one output line. The switch device is suitable for reducing the manufacturing cost because the number of output lines is one.

As an operation switch mounted on the steering wheel of an automobile, the need for a dial-type operation switch is increasing. The dial-type operation switch is used, for example, for adjustment of audio volume, or adjustment or selection of information displayed on a display portion of an instrument panel and can realize a simpler operation in comparison with a press-type operation switch.

For example, a dial-type switch device can be realized by microcomputer control. However, since radiation noise due to a clock signal that causes the microcomputer to operate occurs, it is necessary to perform radiation noise tests at the development stage. Moreover, a large number of man-hours are required for system development and system tests, and there is a problem that the development cost increases.

Furthermore, in microcomputer control, it is difficult to realize compatibility with the method of notifying a voltage dividing value to an ECU by one output line like the method of PTL 1. Measures such as mounting a microcomputer and changing to a LIN (Local Interconnect Network) communication method are necessary, and it is also necessary to make a change on the connection destination ECU side. In this case also, a large number of man-hours are required for system development and system tests, and there is a problem that the development cost increases.

To address the above, a switch device according to one aspect of the present disclosure is a switch device including: a voltage dividing circuit that includes a plurality of switches including a first switch and a second switch, an output line, and a plurality of resistors connected in series to the output line, and outputs a voltage dividing value corresponding to a conduction state of each of the plurality of switches to the output line; an operation interface that includes a dial which rotates in accordance with a user operation; a rotation detection circuit that detects (i) rotation of the dial by a predetermined angle and (ii) a rotation direction of the dial, and generates an angle signal and a direction signal, the angle signal including a pulse that indicates detection of the rotation by the predetermined angle, the direction signal indicating whether the rotation direction is a first direction or a second direction different from the first direction; and a selection circuit that selects whether to output the pulse of the angle signal to control the first switch or to output the pulse of the angle signal to control the second switch, according to whether the direction signal indicates the first direction or the second direction.

Accordingly, the switch device can facilitate cost reduction and can respond to dial operations by the user. Specifically, the switch device replaces a user operation of rotating the dial in the first direction by a predetermined angle with an operation of pressing the first switch. Further, the switch device replaces a user operation of rotating the dial in the second direction by a predetermined angle with an operation of pressing the second switch. Therefore, the voltage dividing circuit can have an inexpensive circuit configuration similar to a conventional circuit configuration. Further, the rotation detection circuit and the selection circuit can be configured as logic circuits and can be inexpensively configured.

Here, the switch device may further include a pulse generation circuit between the rotation detection circuit and the selection circuit, and the pulse generation circuit may generate a one-shot pulse of a predetermined width upon receiving the pulse included in the angle signal, and output the one-shot pulse to the selection circuit.

Accordingly, the pulse width of the one-shot pulse can be set to a predetermined width. For example, it is sufficient so long as the predetermined width is set larger than the minimum pulse width required for a target circuit (for example, an ECU), which is a connection destination of the output line, to determine that the first switch has been pressed. Thereby, the switch device can be easily compatible with an existing ECU.

Here, the switch device may further include a first pulse generation circuit and a second pulse generation circuit. The first pulse generation circuit may put the first switch in a conducting state by supplying the first switch with a one-shot pulse of a predetermined width according to the pulse output from the selection circuit, and the second pulse generation circuit may put the second switch in a conducting state by supplying the second switch with a one-shot pulse of a predetermined width according to the pulse output from the selection circuit.

Accordingly, the predetermined width of the one-shot pulse can be set to any width. For example, the predetermined width can be set larger than the minimum pulse width required for a target circuit (for example, an ECU), which is a connection destination of the output line, to determine that the first switch has been pressed. Thereby, the switch device can be easily compatible with the specifications of an existing ECU.

Here, the switch device may have a configuration that does not include a central processing unit (CPU) that runs a program.

Thereby, it is possible to make the manufacturing cost of the switch device inexpensive. For example, it is possible to make costs of the circuit elements inexpensive, and eliminate the necessity of man-hours and costs of program development. Furthermore, it is possible to eliminate radiation noise due to a clock signal of the CPU.

Here, the operation interface may include: a rotation member that receives a user operation; the dial; and a converter that converts one rotation of the rotation member into R rotations of the dial, where R is a positive real number.

Accordingly, for example, in the case of R=4, it is possible to cause one rotation of the rotation member to correspond to four rotations of the dial. Further, in the case of R=0.25, it is possible to cause one rotation of the rotation member to correspond to a quarter rotation of the dial. Thus, by appropriately combining the size of the predetermined angle described above and the value of R, convenience of a rotation operation by the user can be improved.

Here, the dial may be in a shape of one of a cylinder and a disc.

Accordingly, it is possible to make the rotation operation simple for the user.

Here, the dial may have at least one pair of a north (N) pole and a south (S) pole. The rotation detection circuit may include two magnetic sensors that detect a change in magnetic fields of different directions in the vicinity of the dial. The rotation detection circuit may generate the angle signal and the direction signal from outputs of the two magnetic sensors.

Accordingly, the rotation detection circuit can be inexpensively configured as a magnetic sensor.

Here, the first switch may be a transistor switch, and the second switch may be a transistor switch.

Accordingly, since the first switch and the second switch are configured not as mechanical switches but as circuit elements, cost reduction can be realized.

Here, each of the plurality of switches may correspond to a different one of the plurality of resistors, and may be located between one end of a corresponding resistor and a reference potential line.

Accordingly, it is possible to make the voltage dividing circuit a simple circuit.

Also, a switch system according to one aspect of the present disclosure is a switch system including: the above-described switch device; and a determination device that determines a switch in a conducting state among the plurality of switches based on the voltage dividing value transmitted from the output line.

Accordingly, the switch device can suppress the manufacturing cost and can respond to dial operations by the user. Specifically, the switch device replaces a user operation of rotating the dial in the first direction by a predetermined angle with an operation of pressing the first switch. Further, the switch device replaces a user operation of rotating the dial in the second direction by a predetermined angle with an operation of pressing the second switch. Therefore, the voltage dividing circuit can have an inexpensive circuit configuration similar to a conventional circuit configuration, and a target circuit which determines the voltage dividing circuit transmitted from the output line can also have a configuration similar to a conventional configuration. Further, the rotation detection circuit and the selection circuit can be configured as logic circuits and can be inexpensively configured.

Note that these general or specific aspects may be implemented using a system, a method, or an integrated circuit, or any combination of systems, methods, or integrated circuits.

The following specifically describes embodiments with reference to the drawings.

Note that the following embodiments each illustrate a general or specific example. The numerical values, shapes, materials, elements, the arrangement and connection of the elements, steps, the processing order of the steps etc. illustrated in the following embodiments are mere examples, and are not intended to limit the present disclosure. Among the elements in the following embodiments, those not recited in any of the independent claims representing the most generic concepts are described as optional elements.

Embodiment 1

FIG. 1 is a block diagram illustrating a configuration example of switch system 10 in Embodiment 1.

As shown in the figure, switch system 10 includes switch device 1 and determination device 2. A part on the right side of a broken line in the figure is provided mainly on the steering wheel of an automobile. A part on the left side of the broken line is provided to the body of the automobile as a part of an ECU.

Reference line o0 in the figure is a ground wire with reference voltage VO and connects reference terminal T0 of switch device 1 and input terminal IN0 of determination device 2.

Output line o1 communicates an output of switch device 1 to input terminal IN1 of determination device 2. For example, reference line o0 and output line o1 are provided as a part or all of a spiral cable provided to the rotation shaft of the steering wheel.

Switch device 1 includes voltage dividing circuit 3, operation interface 4, rotation detection circuit 5, pulse generation circuit 6, and selection circuit 7.

Voltage dividing circuit 3 includes a plurality of switches including first switch 21 and second switch 22, output line o1, and a plurality of resistors including first resistor 11 and second resistor 12 connected in series to output line o1, and outputs a voltage dividing value corresponding to a conduction state of each of the plurality of switches to output line o1. Switch device 1 of FIG. 1 further includes third switch 23 and third resistor 13. As for terminal names of the circuit elements in the figure, a terminal on the left side or the upper side will be called a first terminal, and a terminal on the right side or the lower side will be called a second terminal.

First resistor 11 and second resistor 12 are inserted in output line o1 in series. Specifically, the first terminal of first resistor 11 is connected to the second terminal of second resistor 12 and the first terminal of second switch 22. The second terminal of first resistor 11 is connected to the first terminal of first switch 21.

The first terminal of second resistor 12 is connected to input terminal IN1 of determination device 2, the second terminal of fourth resistor 14, and the first terminal of third resistor 13 via output line o1. The second terminal of second resistor 12 is connected to the first terminal of first resistor 11 and the first terminal of second switch 22.

The first terminal of third resistor 13 is connected to output line o1. The second terminal of third resistor 13 is connected to reference line o0.

The first terminal of fourth resistor 14 is connected to a power supply line with power supply voltage V1. The second terminal of fourth resistor 14 is connected to output line o1.

Each of first switch 21 and second switch 22 is a transistor switch and has, in addition to the first and second terminals, a control terminal for controlling conduction and non-conduction. Note that, though a bipolar transistor may be used as the transistor switch, a field-effect transistor with a small ON resistance, which does not easily influence the resistance values of first resistor 11 and second resistor 12 and which does not require a base current and enables power saving, may be used.

The first terminal of first switch 21 is connected to the second terminal of first resistor 11. The second terminal of first switch 21 is connected to reference line o0. Switch control signal C1 output from selection circuit 7 is input to the control terminal of first switch 21. First switch 21 is in a conducting state when switch control signal C1 is at a high level and is in a non-conducting state when switch control signal C1 is at a low level.

The first terminal of second switch 22 is connected to the second terminal of second resistor 12 and the first terminal of first resistor 11. The second terminal of second switch 22 is connected to reference line o0. Switch control signal C2 output from selection circuit 7 is input to the control terminal of second switch 22. Second switch 22 is in a conducting state when switch control signal C2 is at a high level and is in a non-conducting state when switch control signal C2 is at a low level.

Third switch 23 is a mechanical switch that becomes conductive, for example, when being pressed by a user. The first terminal of third switch 23 is connected to the first terminal of second resistor 12, the first terminal of third resistor 13, and the second terminal of fourth resistor 14 via output line o1. Third switch 23 can be used, for example, to decide or finalize a menu item selected by a dial operation. Note that third switch 23 may be two or more switches connected in parallel and interlocked in order to enhance reliability.

Voltage dividing circuit 3 outputs a voltage dividing value according to conduction states of the plurality of switches to output line o1. That is, the voltage dividing value differs depending on which switch among first switch 21 to third switch 23 is in a conducting state. For example, voltage dividing circuit 3 can be configured the same as FIG. 2 of PTL 1 except for first switch 21 and second switch 22.

Operation interface 4 includes a dial which rotates in accordance with a user operation. The dial is, for example, in a shape of a cylinder having a rotation shaft.

Rotation detection circuit 5 detects rotation of the dial by a predetermined angle and a rotation direction of the dial, and generates angle signal S1 and direction signal S2, angle signal S1 including a pulse that indicates detection of the rotation by the predetermined angle, direction signal S2 indicating whether the rotation direction is a first direction or a second direction different from the first direction.

When receiving the pulse included in angle signal S1 from rotation detection circuit 5, pulse generation circuit 6 generates one-shot pulse P1 with a predetermined width. Here, the predetermined width is set so that the minimum duration time of a voltage dividing value that enables determination device 2 to determine that a switch has been pressed is satisfied.

Selection circuit 7 selects whether the pulse of angle signal S1 is to be output for control of first switch 21 or for control of second switch 22 according to whether direction signal S2 indicates the first direction or the second direction. Specifically, selection circuit 7 is a switch circuit as a one-input two-output demultiplexer to which one-shot pulse P1 from pulse generation circuit 6 is input, and selects any one of first switch 21 and second switch 22 as an output destination of one-shot pulse P1 according to direction signal S2.

Next, a specific example of operation interface 4 will be described.

Figure 2:
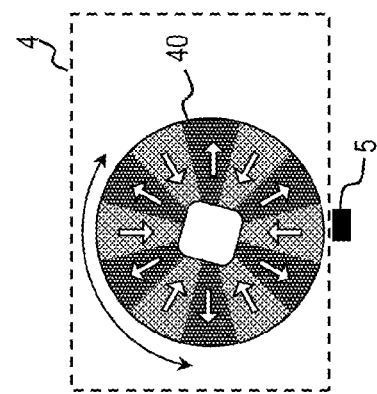
FIG. 2 is a diagram illustrating an arrangement example of an operation interface and a rotation detection circuit in FIG. 1.

FIG. 2 is a diagram illustrating an arrangement example of operation interface 4 and rotation detection circuit 5 in FIG. 1. In FIG. 2, operation interface 4 includes dial 40. The figure schematically illustrates a section obtained by cutting dial 40 in a shape of a cylinder with a plane vertical to the rotation shaft. Dial 40 is a magnetic body that includes six pairs of N-pole and S-pole. Rotation detection circuit 5 is a magnetic detection sensor and detects a change in the magnetic field accompanying rotation of dial 40. In the example of the figure, rotation detection circuit 5 is capable of detecting twelve polarity changes by one rotation of dial 40. In this case, the predetermined angle described above is 30 degrees.

Next, a more detailed circuit configuration example of switch device 1 will be described.

Figure 3:
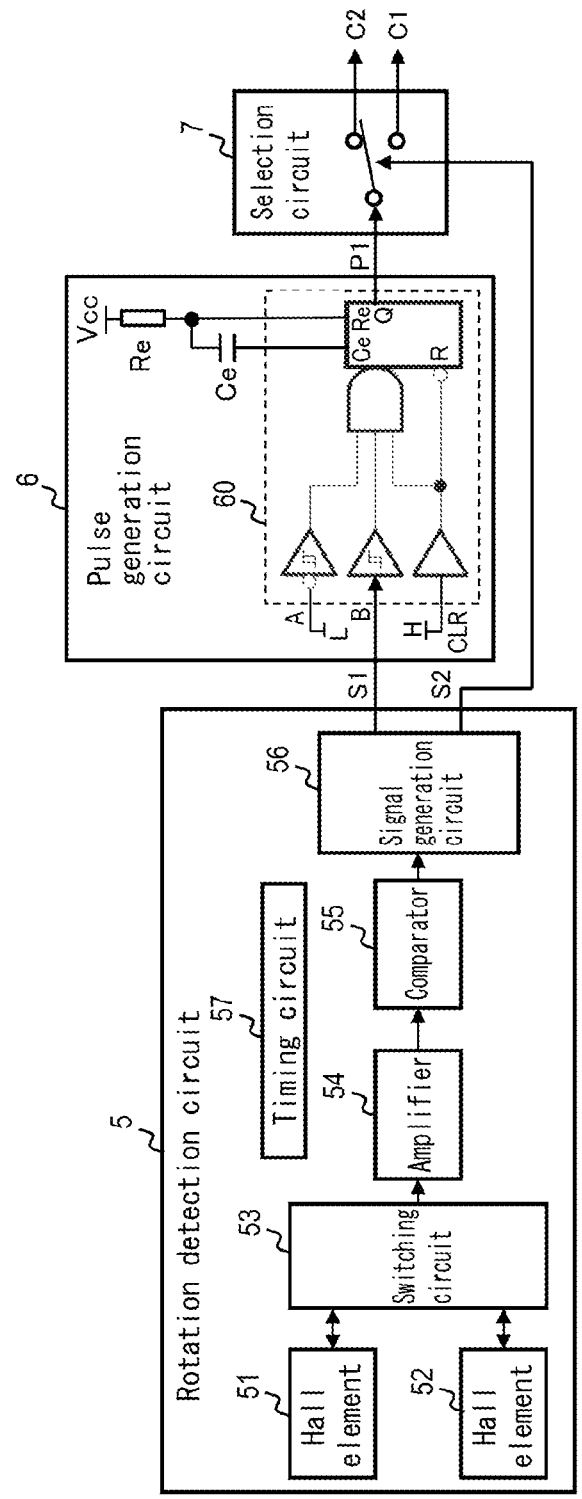
FIG. 3 is a diagram illustrating a specific example of a rotation detection circuit, a pulse generation circuit, and a selection circuit in FIG. 1.

FIG. 3 is a diagram illustrating a specific example of rotation detection circuit 5, pulse generation circuit 6, and selection circuit 7 in FIG. 1.

In the figure, rotation detection circuit 5 is provided with hall elements 51 and 52, switching circuit 53, amplifier 54, comparator 55, signal generation circuit 56, and timing circuit 57.

Two hall elements 51 and 52 are sensors that detect magnetic fields in directions that are different from each other. Hall elements 51 and 52 detect, for example, magnetic fields in directions that are orthogonal to each other.

Switching circuit 53 alternately selects one of two detection signals from hall elements 51 and 52 and outputs the detection signal to amplifier 54.

Amplifier 54 amplifies the detection signal from switching circuit 53.

Comparator 55 determines whether the polarity has been reversed or not by making a threshold determination of the detection signal amplified by amplifier 54. For example, in the example of FIG. 2, the polarity is reversed each time dial 40 rotates by 30 degrees as the predetermined angle. Comparator 55 generates one pulse each time dial 40 rotates by the predetermined angle according to each of hall elements 51 and 52.

Signal generation circuit 56 detects rotation of the dial by a predetermined angle and a rotation direction of the dial from a determination result of comparator 55 corresponding to each of hall elements 51 and 52, and generates angle signal S1 and direction signal S2, angle signal S1 including a pulse that indicates detection of the rotation by the predetermined angle, direction signal S2 indicating whether the rotation direction is the first direction or the second direction different from the first direction.

Timing circuit 57 is a sequencer circuit that controls operation timings inside rotation detection circuit 5, such as operation timings of switching circuit 53 and the like.

Further, pulse generation circuit 6 of FIG. 3 is provided with one-shot circuit 60, resistor Re and capacitor Ce.

When a pulse occurs in angle signal S1 from rotation detection circuit 5, one-shot circuit 60 generates one-shot pulse P1 with a predetermined width. A retriggerable monostable multivibrator or the like can be used for one-shot circuit 60. In the example in the figure, angle signal S1 from signal generation circuit 56 is input to input terminal B of one-shot circuit 60, and one-shot circuit 60 generates one-shot pulse P1 with the predetermined width, being triggered by a rising edge included in angle signal S1.

Resistor Re and capacitor Ce are a time constant circuit that defines the predetermined width of one-shot pulse P1. The time constant can be set as follows. For example, when determination device 2 performs 10 ms interval sampling three times in determination of the voltage dividing value, the predetermined width may be about 30 to 40 ms.

Selection circuit 7 is a one-input two-output switch circuit. For example, selection circuit 7 selects first switch 21 as an output destination of one-shot pulse P1 from pulse generation circuit 6 when direction signal S2 indicates the first direction, and selects second switch 22 as the output destination of one-shot pulse P1 from pulse generation circuit 6 when direction signal S2 indicates the second direction. In other words, selection circuit 7 outputs one-shot pulse P1 as switch control signal C1 to the control terminal of first switch 21 when direction signal S2 indicates the first direction, and outputs one-shot pulse P1 as switch control signal C2 to the control terminal of second switch 22 when direction signal S2 indicates the second direction.

Description will be made on an operation of switch system 10 according to Embodiment 1 configured as described above.

Figure 4:
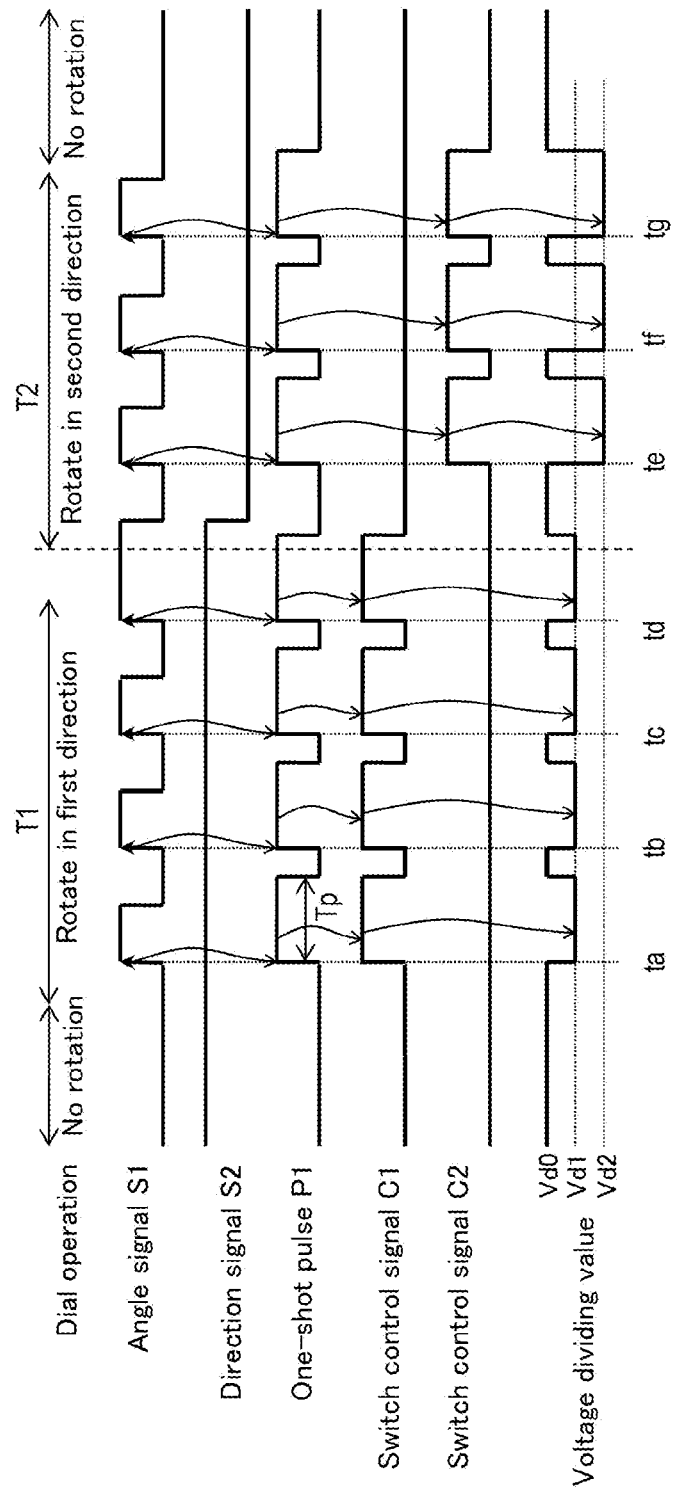
FIG. 4 is a timing chart showing an operation example of the switch system of FIG. 1.

FIG. 4 is a timing chart showing an operation example of switch system 10 of FIG. 1. The figure illustrates a voltage waveform of each of angle signal S1, direction signal S2, one-shot pulse P1, switch control signals C1 and C2 and the voltage dividing value. Further, the "dial operation" field at the top shows states of dial 40 by user operations. The state of "no rotation" indicates a state in which dial 40 is not rotating. It is shown that dial 40 is rotating in the first direction in period T1. It is shown that dial 40 is rotating in the second direction in period T2.

In the period of "no rotation" before period T1, all the signals are constant without changing. As for the voltage dividing value at this time, since first switch 21, second switch 22 and third switch 23 are in a non-conducting state, the potential of output line of is voltage dividing value Vd0 that is obtained by dividing power supply voltage V1 by fourth resistor 14 and third resistor 13.

It is assumed that, in period T1, dial 40 of FIG. 2 rotates in the first direction by about 120 degrees by a user operation. Rotation detection circuit 5 generates one pulse every 30 degrees as the predetermined angle, as angle signal S1, and generates four pulses in total. Further, rotation detection circuit 5 maintains a high level indicating the first direction as direction signal S2.

At time ta, pulse generation circuit 6 generates one-shot pulse P1, being triggered by a rising edge of angle signal S1. At this time, since direction signal S2 is at the high level, selection circuit 7 outputs one-shot pulse P1 to first switch 21 as the pulse of switch control signal C1. First switch 21 is in a conducting state in the high level period of switch control signal C1, and output line of outputs voltage dividing value Vd1 in period Tp in which first switch 21 is in the conducting state. By successively sampling that the voltage dividing value of output line of is Vd1 a plurality of times (for example, three times), determination device 2 determines that first switch 21 corresponding to voltage dividing value Vd1 is in the conducting state. Thus, since the potential of output line of is voltage dividing value Vd1 in period Tp from time ta, determination device 2 determines that first switch 21 has been pressed.

An operation in period Tp from time tb, an operation in period Tp from time tc, and an operation in period Tp from time td are the same as the operation in period Tp from time to described above.

As a result, determination device 2 determines that first switch 21 has been pressed four times in period T1. Thus, switch device 1 causes determination device 2 to determine a rotation operation of dial 40 in the first direction by the predetermined angle as a press of first switch 21. Further, switch device 1 causes determination device 2 to determine a rotation operation of dial 40 in the first direction by an angle larger than the predetermined angle as a plurality of successive presses of first switch 21.

Furthermore, it is assumed that, in period T2, dial 40 of FIG. 2 rotates in the second direction opposite to the first direction by about 90 degrees by a user operation. Rotation detection circuit 5 generates one pulse every 30 degrees as the predetermined angle, as angle signal S1, and generates three pulses in total. Further, rotation detection circuit 5 outputs a low level indicating the second direction as direction signal S2.

At time te, pulse generation circuit 6 generates one-shot pulse P1, being triggered by a rising edge of angle signal S1. At this time, since direction signal S2 is at the low level, selection circuit 7 outputs one-shot pulse P1 to second switch 22 as the pulse of switch control signal C2. Second switch 22 is in a conducting state in the high level period of switch control signal C2, and output line of outputs voltage dividing value Vd2 in period Tp in which second switch 22 is in the conducting state. By successively sampling that the voltage dividing value of output line of is Vd2 a plurality of times (for example, three times), determination device 2 determines that second switch 22 corresponding to voltage dividing value Vd2 is in the conducting state. Thus, since the potential of output line of is voltage dividing value Vd2 in period Tp from time te, determination device 2 determines that second switch 22 has been pressed.

An operation in period Tp from time tf and an operation in period Tp from time tg are the same as the operation in period Tp from time te described above.

As a result, determination device 2 determines that second switch 22 has entered a conducting state three times in period T2. Thus, switch device 1 causes determination device 2 to determine a rotation operation of dial 40 in the second direction by the predetermined angle as a press of second switch 22. Further, switch device 1 causes determination device 2 to determine a rotation operation of dial 40 in the second direction by an angle larger than the predetermined angle as successive presses of second switch 22.

As described above, switch device 1 can realize cost reduction and can respond to dial operations by the user. Specifically, switch device 1 replaces a user operation of rotating dial 40 in the first direction by a predetermined angle with an operation of pressing first switch 21. Further, switch device 1 replaces a user operation of rotating dial 40 in the second direction by a predetermined angle with an operation of pressing second switch 22. Therefore, voltage dividing circuit 3 can have an inexpensive circuit configuration similar to a conventional circuit configuration. Further, rotation detection circuit 5 and selection circuit 7 can be configured as logic circuits and can be inexpensively configured.

Further, the pulse width of one-shot pulse P1 can be set to a predetermined width. For example, the predetermined width can be set larger than the minimum pulse width required for a target circuit (for example, an ECU), which is a connection destination of output line o1, to determine that first switch 21 has been pressed. Thereby, switch device 1 can be easily compatible with an existing ECU.

Furthermore, switch device 1 is configured without including a CPU that executes a program. Thereby, it is possible to make costs of the circuit elements of switch device 1 inexpensive and eliminate the necessity of man-hours and costs of program development. In this case, it is possible to eliminate radiation noise due to a clock signal of the CPU.

Further, since first switch 21 and second switch 22 are configured not as mechanical switches but as transistor switches, cost reduction can be realized.

Next, Variation 1 and Variation 2 of switch device 1 of Embodiment 1 will be described.

Figure 5:
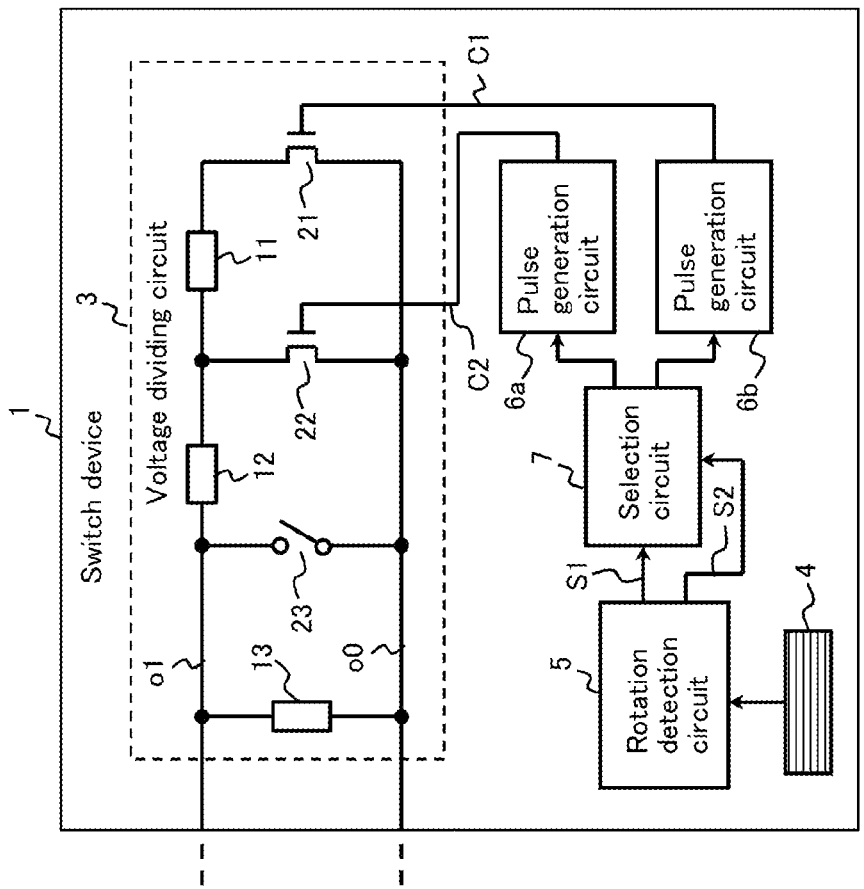
FIG. 5 is a block diagram illustrating Variation 1 of a switch device in FIG. 1.

FIG. 5 is a block diagram illustrating Variation 1 of switch device 1 in FIG. 1. In comparison with the configuration of FIG. 1, switch device 1 of FIG. 5 is different in that two pulse generation circuits 6a and 6b are provided instead of pulse generation circuit 6. Description will be made mainly on different points, avoiding duplicate description of the same points as FIG. 1.

Selection circuit 7 of FIG. 5 may have the same internal configuration as FIG. 1, but the input source and output destination of selection circuit 7 are different. Angle signal S1 from rotation detection circuit 5 is input to selection circuit 7 of FIG. 5, and selection circuit 7 selects an output destination of angle signal S1 according to direction signal S2. That is, selection circuit 7 outputs the pulse of angle signal S1 to pulse generation circuit 6a when direction signal S2 is at the high level, and outputs the pulse of angle signal S1 to pulse generation circuit 6b when direction signal S2 is at the low level. Each of pulse generation circuits 6a and 6b have the same configuration as pulse generation circuit 6.

Effects equal to those of FIG. 1 are obtained by Variation 1 illustrated in FIG. 5.

Next, Variation 2 will be described.

Figure 6:
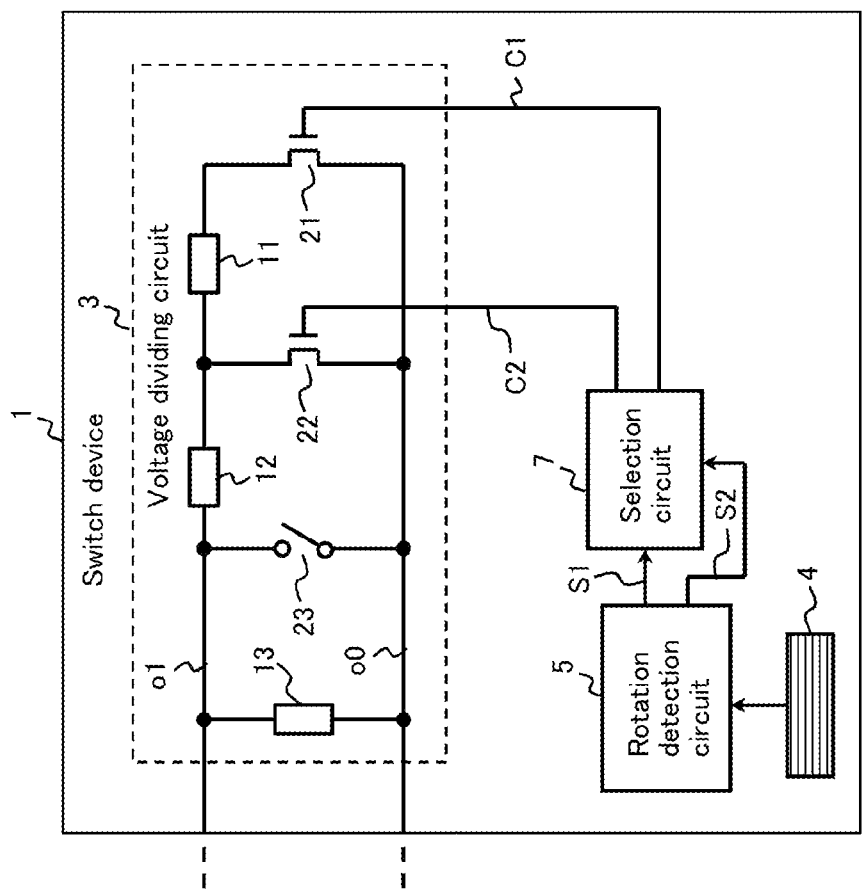
FIG. 6 is a block diagram illustrating Variation 2 of the switch device in FIG. 1.

FIG. 6 is a block diagram illustrating Variation 2 of switch device 1 in FIG. 1. In comparison with the configuration of FIG. 1, switch device 1 of FIG. 6 is different in that pulse generation circuit 6 is deleted. Description will be made mainly on different points, avoiding duplicate description of the same points as FIG. 1.

In FIG. 6, pulse generation circuit 6 is deleted, and angle signal S1 is input to selection circuit 7 instead of one-shot pulse P1. The pulse width of angle signal S1 changes depending on the rotation speed of dial 40. When most of the pulse width included in angle signal S1 satisfies the pulse width condition required for determination of the voltage dividing value by determination device 2, the configuration of Variation 2 may be used in which pulse generation circuit 6 is not provided, and angle signal S1 is input to selection circuit 7. However, when rotation of dial 40 by the user is too fast, the pulse width of angle signal S1 decreases, and there may be a case where the duration time of a corresponding voltage dividing value cannot be determined by determination device 2. In this case, such specifications that it is allowed to ignore too fast rotation of dial 40 may be adopted.

Embodiment 2

In Embodiment 2, description will be made on a configuration example in which a rotation member that receives a user operation and a converter that converts one rotation of the rotation member into R rotations of the dial, where R is a real number.

Figure 7:
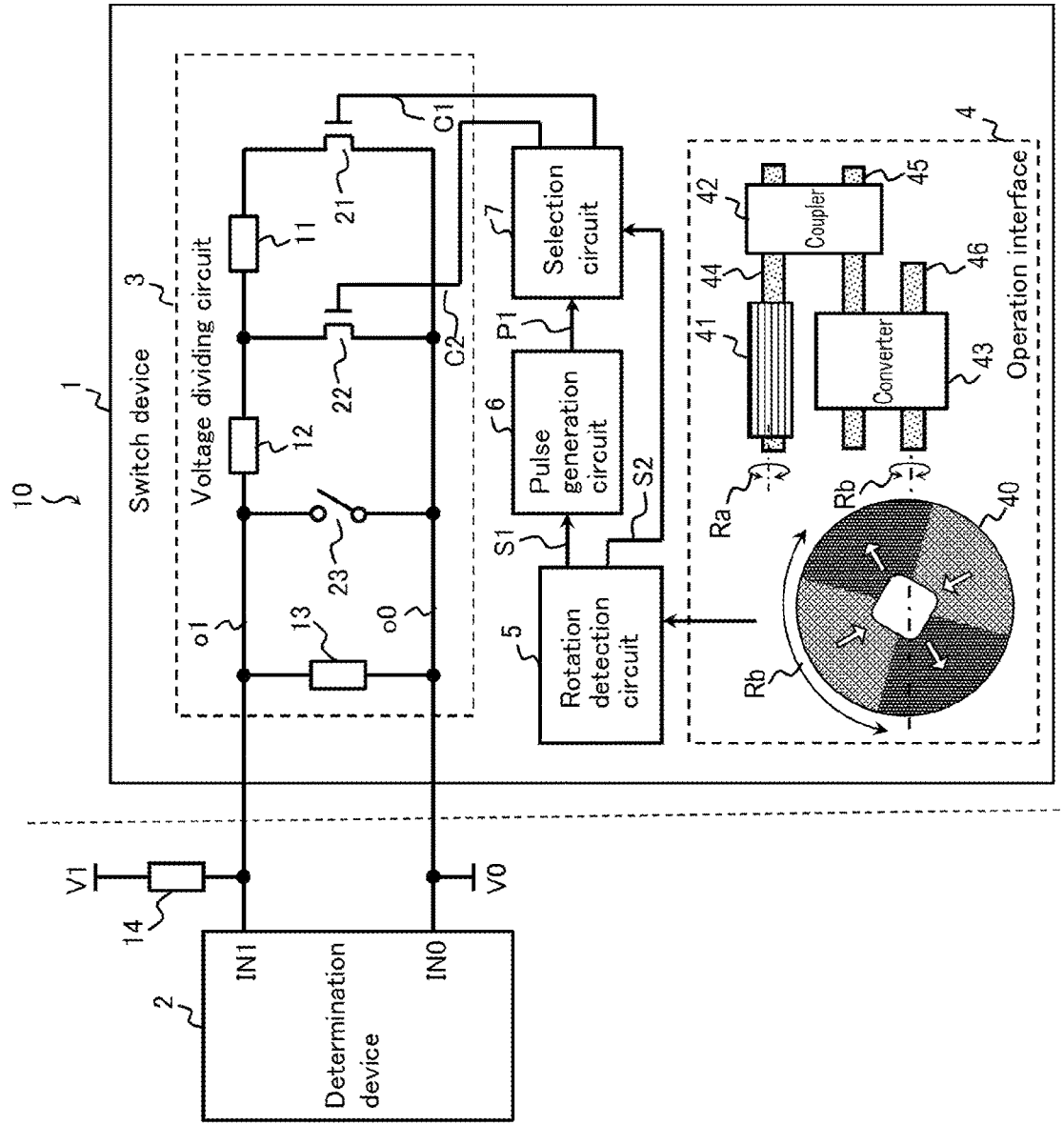
FIG. 7 is a block diagram illustrating a configuration example of a switch device in a switch system according to Embodiment 2.

FIG. 7 is a block diagram illustrating a configuration example of switch device 1 in switch system 10 according to Embodiment 2. In comparison with the configuration of FIG. 1, switch device 1 in the figure is different in the configuration of operation interface 4. Hereinafter, description will be made mainly on different points, avoiding duplicate description of the same points.

Operation interface 4 is provided with dial 40, rotation member 41, coupler 42, converter 43, and shaft bars 44, 45, and 46.

Dial 40 is a magnetic body similar to that of FIG. 2. However, though FIG. 2 illustrates an example of a magnetic body with six pairs of N-pole and S-pole, FIG. 7 illustrates an example of a magnetic body with two pairs of N-pole and S-pole. Rotation detection circuit 5 is capable of detecting four polarity changes by one rotation of dial 40 of FIG. 7.

Rotation member 41 is a cylindrical member that receives a user operation and rotates around shaft bar 44.

Coupler 42 couples shaft bar 44 and shaft bar 45 at a rotation ratio of 1:1. Note that the rotation ratio need not be 1:1.

Converter 43 couples shaft bar 45 and shaft bar 46 at a rotation ratio of 1:R. Here, R is a positive or negative real number. Positive means that the rotation direction of rotation member 41 and the rotation direction of dial 40 are the same, and negative means that the rotation directions are opposite to each other.

Shaft bar 46 is fixed to dial 40 as the rotation shaft of dial 40.

By this configuration, operation interface 4 converts one rotation of rotation member 41 to R rotations of dial 40. For example, in the case of R=2, it is possible to cause one rotation of rotation member 41 to correspond to two rotations of dial 40. Further, in the case of R=0.5, it is possible to cause one rotation of rotation member 41 to correspond to a half rotation of dial 40. Thus, by appropriately combining the size of the predetermined angle described above and the value of R, convenience of a rotation operation by the user can be improved. Further, an inexpensive magnetic body with a small number of polar pairs can be used for dial 40. That is, since the number of rotations is converted in the case of using dial 40 with a small number of polar pairs, the same usability as a magnetic body with a large number of polar pairs can be realized.

Figure 8:
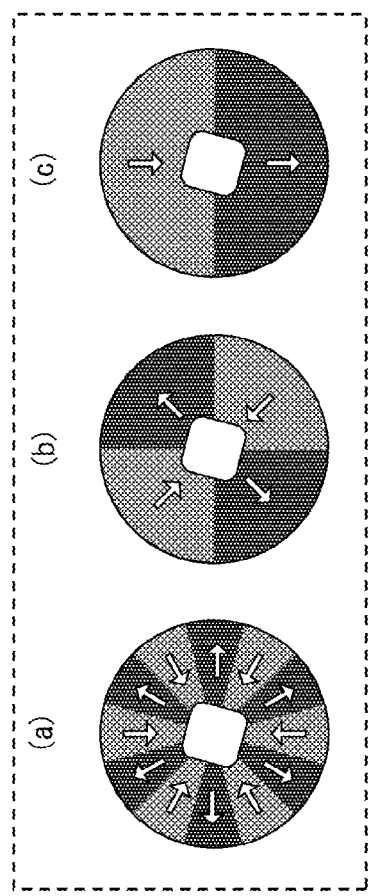
FIG. 8 illustrates examples of the number of polar pairs of a dial in the switch system according to Embodiment 2.

Note that the number of polar pairs of dial 40 of FIG. 7 needs to be at least one. FIG. 8 illustrates examples of the number of polar pairs of dial 40. Here, (a), (b), and (c) of FIG. 8 show examples of six pairs, two pairs, and one pair, respectively. Even if dial 40 is any of the magnetic bodies of FIG. 8, it is possible to appropriately set usability of rotation member 41 if the conversion rate R of converter 43 is appropriately set. Note that the number of polar pairs of dial 40 is not limited to the examples of FIG. 8 but may be any number.

Further, dial 40 is not limited to the shape of a cylinder but may be in a shape of a disc.

Note that, though a configuration example using magnetic rotary encoders as operation interface 4 and rotation detection circuit 5 has been shown, the configuration is not limited thereto. Operation interface 4 and rotation detection circuit 5 may be, for example, optical, mechanical, or electrostatic rotary encoders.

Further, switch device 1 and switch system 10 may be provided to transport equipment other than an automobile. For example, they may be provided to a ship, an airplane, a game machine, or the like.

A switch device and a switch system according to one or more aspects have been described above based on embodiments. However, the present disclosure is not limited to the embodiments. Forms obtained by making various kinds of modifications that one skilled in the art conceives in the present embodiments or forms constructed by combining elements in the different embodiments may be included within the scope of the one or more aspects as far as not departing from the spirit of the present disclosure.

For example, if a plurality of other switches in addition to the switches described in the embodiments are provided to a steering wheel, a plurality of voltage dividing circuits 3 may be provided to correspond to the plurality of other switches.

While various embodiments have been described herein above, it is to be appreciated that various changes in form and detail may be made without departing from the spirit and scope of the present disclosure as presently or hereafter claimed.

The disclosure of the following patent application including specification, drawings, and claims is incorporated herein by reference in its entirety: Japanese Patent Application No. 2021-006322 filed on Jan. 19, 2021.

The switch device and switch system of the present disclosure can be used, for example, for a steering wheel of transport equipment and the like.

The invention claimed is:

1. A switch device comprising:
   a voltage dividing circuit that includes a plurality of switches including a first switch and a second switch connected with the first switch, an output line, and a plurality of resistors connected in series to the output line, and outputs a voltage dividing value corresponding to a conduction state of each of the plurality of switches to the output line;
   an operation interface that includes a dial which rotates in accordance with a user operation;
   a rotation detection circuit that detects (i) rotation of the dial by a predetermined angle and (ii) a rotation direction of the dial, and generates an angle signal and a direction signal, the angle signal including a pulse that indicates detection of the rotation by the predetermined angle, the direction signal indicating whether the rotation direction is a first direction or a second direction different from the first direction;
   a selection circuit coupled to the first switch and the second switch of the voltage dividing circuit; and
   a pulse generation circuit between the rotation detection circuit and the selection circuit,
   wherein the pulse generation circuit receives the angle signal from the rotation detection circuit, generates a one-shot pulse of a predetermined width upon receiving the pulse included in the angle signal, and outputs the one-shot pulse to the selection circuit,
   wherein the predetermined width is set such that the voltage dividing value indicates whether the first switch or the second switch is in a conducting state,
   wherein the selection circuit is between the pulse generation circuit and the first switch, between the pulse generation circuit and the second switch, between the rotation detection circuit and the first switch, and between the rotation detection circuit and the second switch,
   wherein the selection circuit receives the direction signal from the rotation detection circuit, and receives the one-shot pulse from the pulse generation circuit,
   wherein the selection circuit selects a first output destination at a control terminal of the first switch of the voltage dividing circuit for the one-shot pulse from the pulse generation circuit when the direction signal from the rotation detection circuit indicates the first direction, and selects a second output destination at a control terminal of the second switch of the voltage dividing circuit for the one-shot pulse from the pulse generation circuit when the direction signal from the rotation detection circuit indicates the second direction.

2. The switch device according to claim 1,
wherein the first switch, the second switch, the rotation detection circuit, and the selection circuit are configured as a logic circuit, and
the switch device does not include a central processing unit (CPU) that runs a program.

3. The switch device according to claim 1, wherein the operation interface includes:
a rotation member that receives the user operation;
the dial; and
a converter that converts one rotation of the rotation member into R rotations of the dial, where R is a real number.

4. The switch device according to claim 1,
wherein the dial is in a shape of one of a cylinder and a disc.

5. The switch device according to claim 1,
wherein the dial has at least one pair of a north (N) pole and a south (S) pole, and
the rotation detection circuit includes two magnetic sensors corresponding to magnetic fields of different directions, and generates the angle signal and the direction signal from outputs of the two magnetic sensors.

6. The switch device according to claim 1,
wherein the first switch is a transistor switch, and
the second switch is a transistor switch.

7. The switch device according to claim 1,
wherein each of the plurality of switches corresponds to a different one of the plurality of resistors, and is located between one end of a corresponding resistor and a reference potential line.

8. A switch system comprising:
the switch device according to claim 1; and
a determination device that determines whether the first switch or the second switch is in the conducting state based on the voltage dividing value transmitted from the output line.

* * * * *